(12) United States Patent
Park

(10) Patent No.: US 8,237,185 B2
(45) Date of Patent: Aug. 7, 2012

(54) SEMICONDUCTOR LIGHT EMITTING DEVICE WITH INTEGRATED ESD PROTECTION

(75) Inventor: Hyung Jo Park, Anyang (KR)

(73) Assignee: LG Innotek Co., Ltd., Seoul (KR)

( * ) Notice: Subject to any disclaimer, the term of this patent is extended or adjusted under 35 U.S.C. 154(b) by 352 days.

(21) Appl. No.: 12/447,118

(22) PCT Filed: Dec. 24, 2008

(86) PCT No.: PCT/KR2008/007666
§ 371 (c)(1),
(2), (4) Date: Apr. 24, 2009

(87) PCT Pub. No.: WO2009/084860
PCT Pub. Date: Jul. 9, 2009

(65) Prior Publication Data
US 2011/0001145 A1    Jan. 6, 2011

(30) Foreign Application Priority Data
Jan. 3, 2008    (KR) .................. 10-2008-0000841

(51) Int. Cl.
*H01L 33/38* (2010.01)
(52) U.S. Cl. ............ 257/99; 257/30; 257/E23.058; 257/E33.064; 257/E33.065

(58) Field of Classification Search .............. 257/99
See application file for complete search history.

(56) References Cited

U.S. PATENT DOCUMENTS

| | | | | |
|---|---|---|---|---|
| 5,977,565 A | * | 11/1999 | Ishikawa et al. | 257/81 |
| 7,173,311 B2 | * | 2/2007 | Sato et al. | 257/355 |
| 7,645,689 B2 | * | 1/2010 | Seo et al. | 438/478 |
| 2005/0168899 A1 | * | 8/2005 | Sato et al. | 361/91.1 |
| 2006/0157718 A1 | * | 7/2006 | Seo et al. | 257/82 |
| 2007/0246716 A1 | * | 10/2007 | Bhat et al. | 257/81 |

FOREIGN PATENT DOCUMENTS

| | | | |
|---|---|---|---|
| CN | 1176497 A | | 3/1998 |
| KR | 10-2005-0070459 | * | 7/2005 |
| KR | 10-2005-0082259 A | | 8/2005 |
| KR | 10-2006-0050956 A | | 5/2006 |
| KR | 10-0593942 B1 | | 6/2006 |
| KR | 10-0613272 B1 | | 8/2006 |

* cited by examiner

*Primary Examiner* — Nathan Ha
*Assistant Examiner* — Abul Kalam
(74) *Attorney, Agent, or Firm* — Birch, Stewart, Kolasch & Birch, LLP

(57) ABSTRACT

Embodiments provide a semiconductor light emitting device which comprises a light emitting structure comprising a plurality of compound semiconductor layers, an insulation layer on an outer surface of the light emitting structure, an ohmic layer under the light emitting structure and on an outer surface of the insulation layer, a first electrode layer on the light emitting structure, and a tunnel barrier layer between the first electrode layer and the ohmic layer.

20 Claims, 9 Drawing Sheets

[Figure 1]
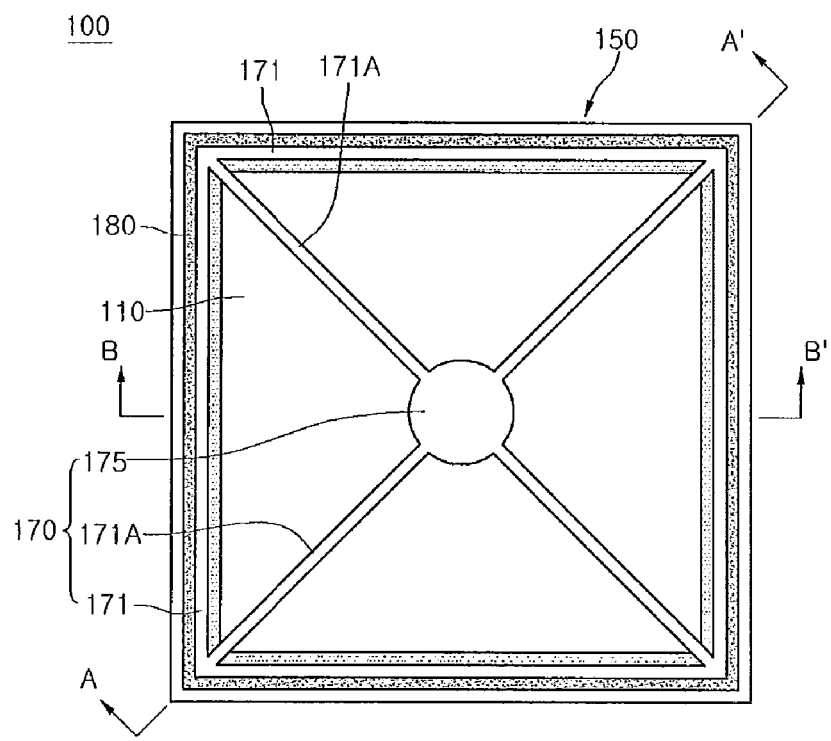
[Figure 2]
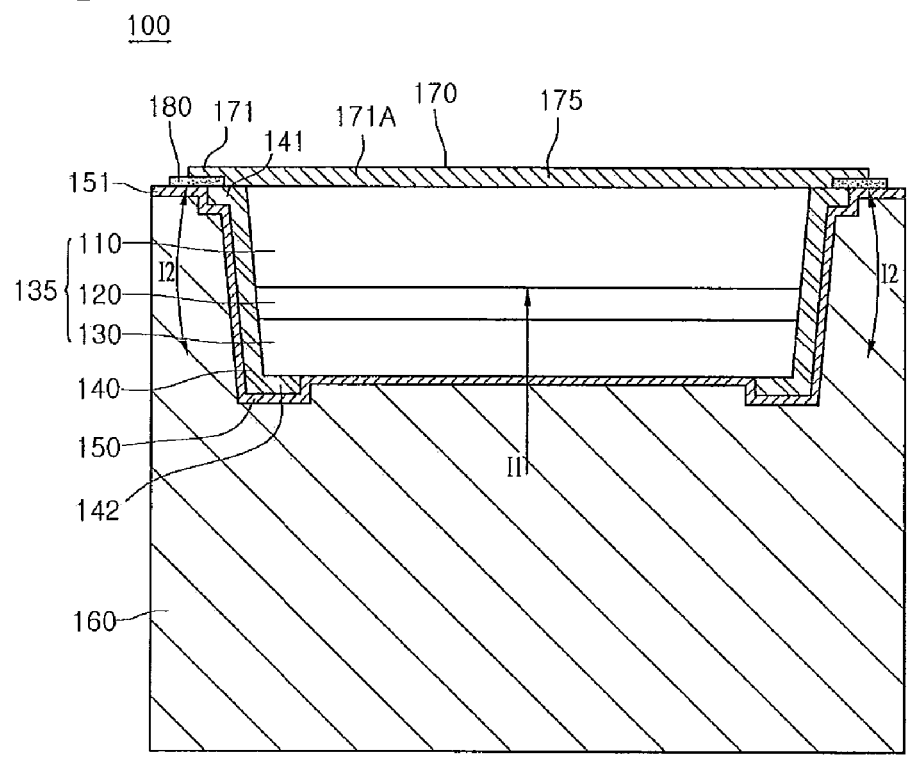

[Figure 3]
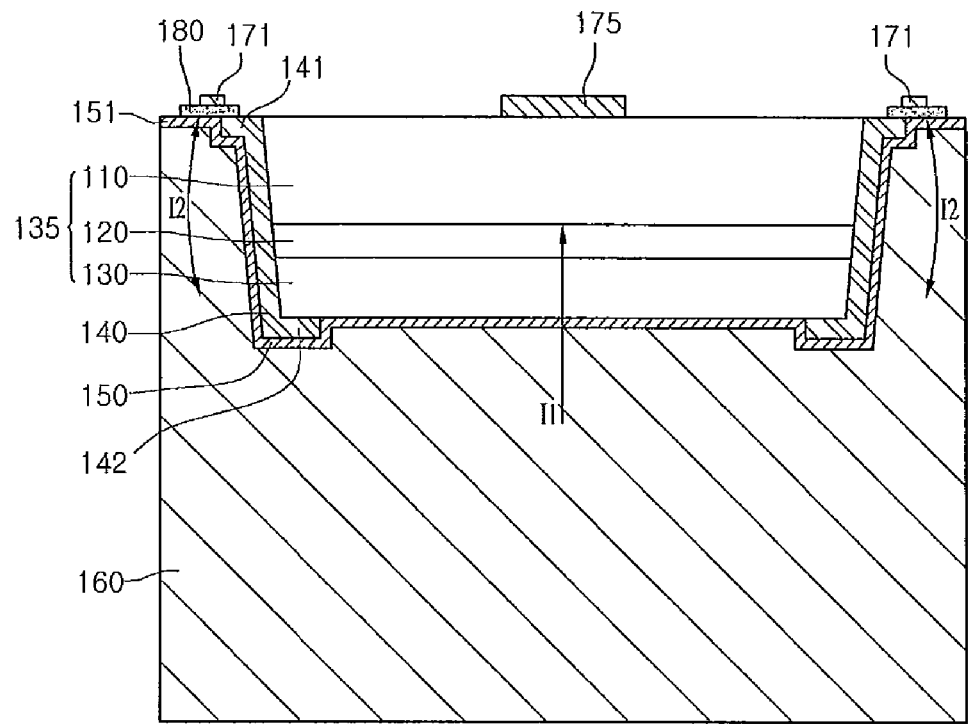
[Figure 4]
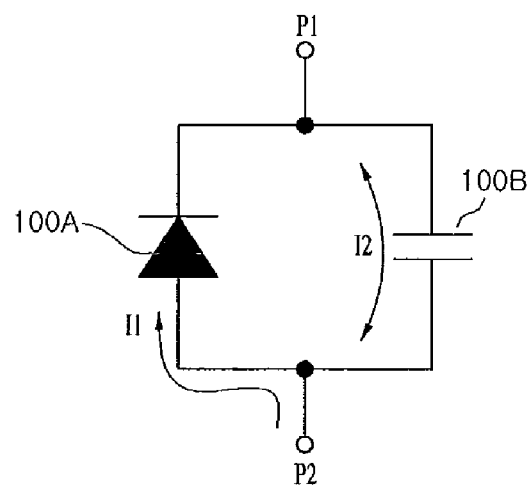

[Figure 5]
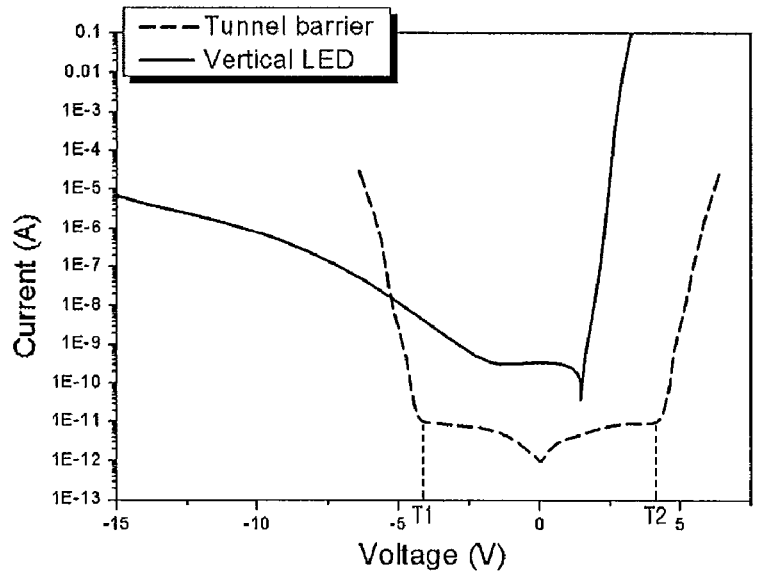
[Figure 6]
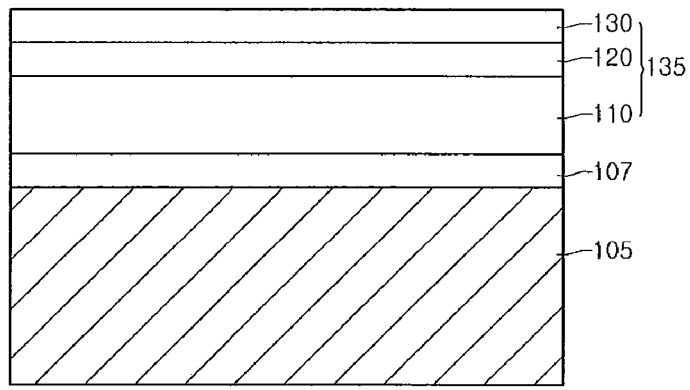
[Figure 7]
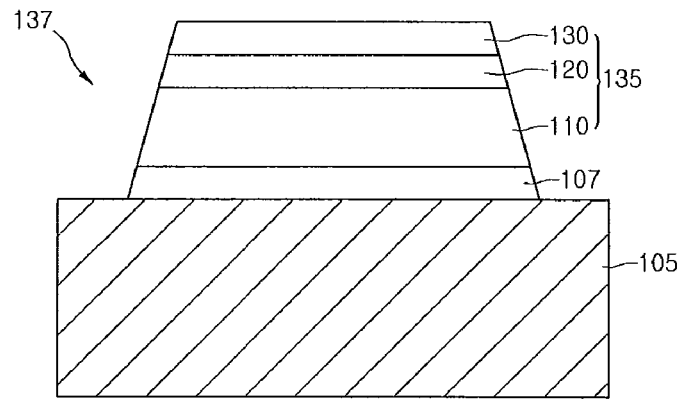

[Figure 8]
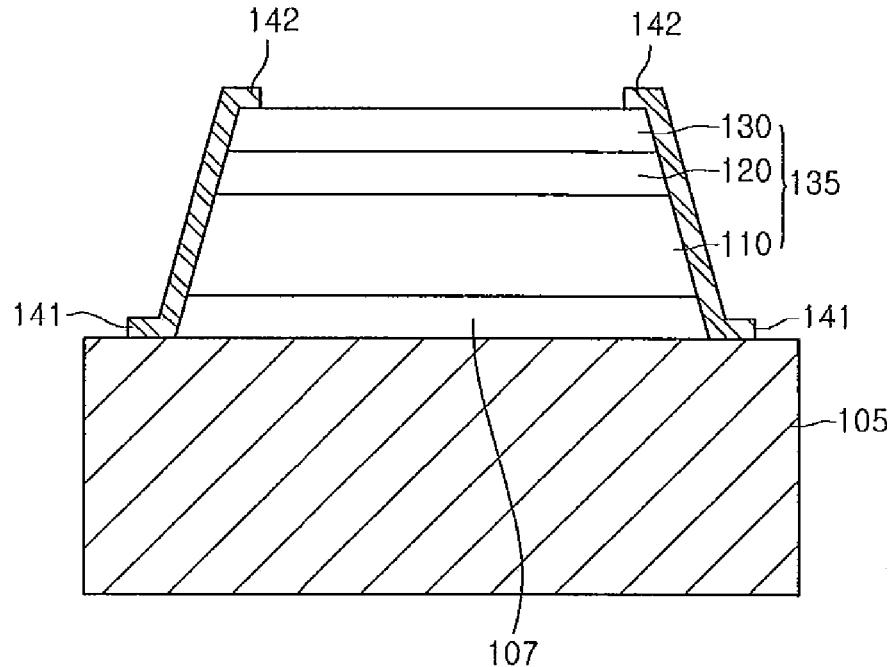
[Figure 9]
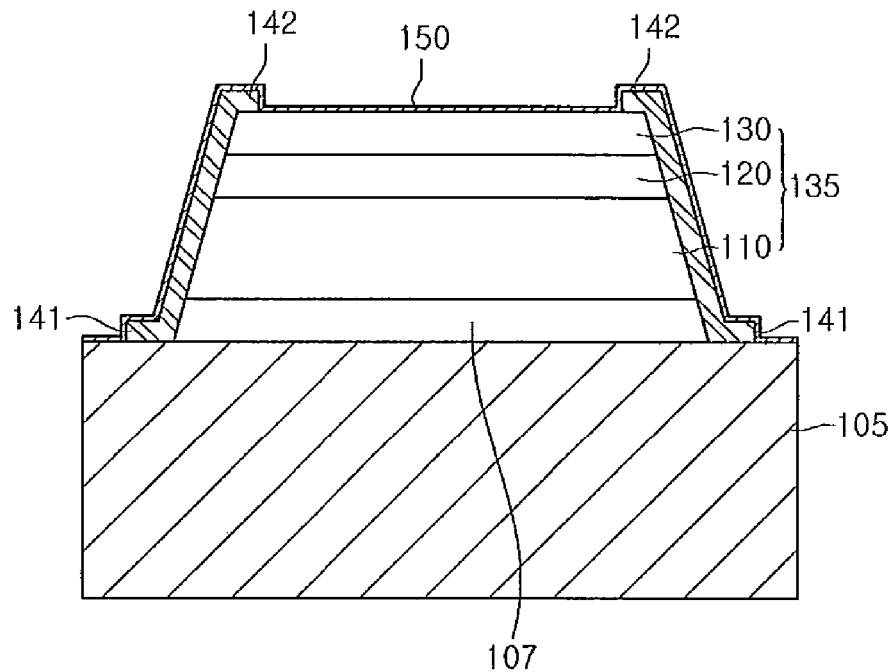

[Figure 10]
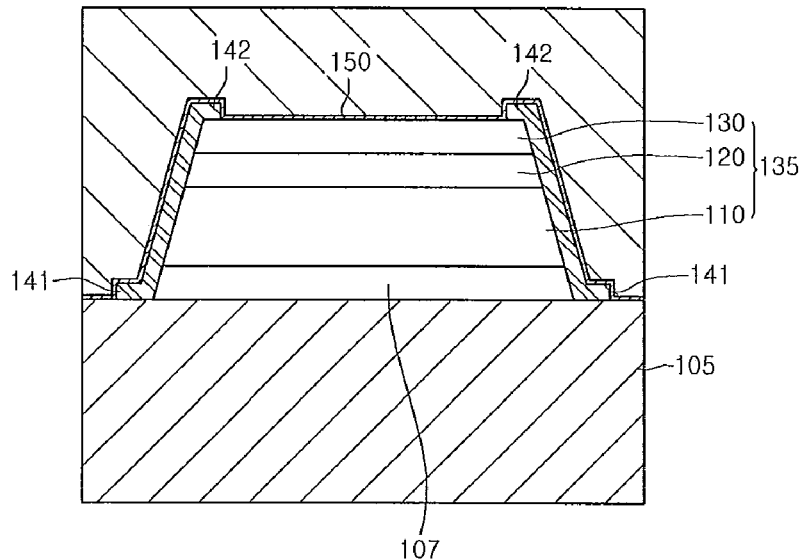
[Figure 11]
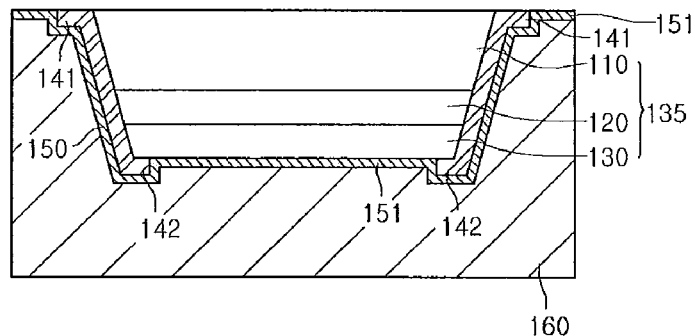
[Figure 12]
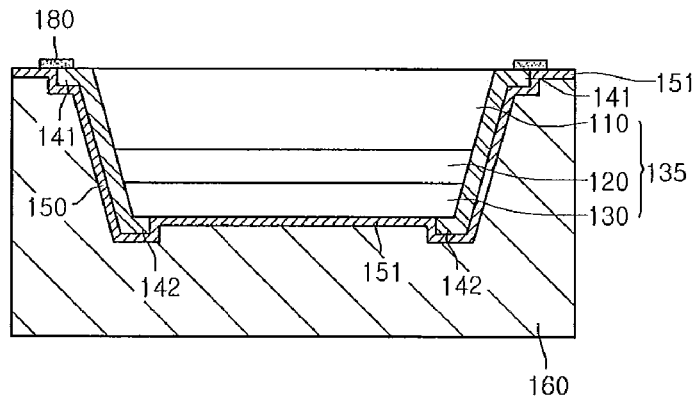

[Figure 13]
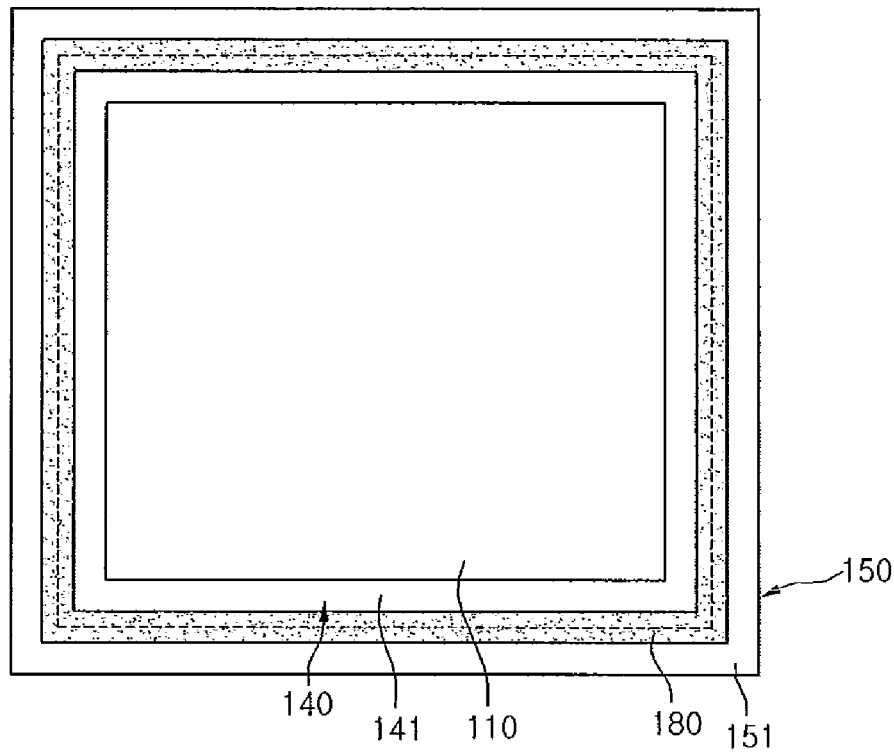
[Figure 14]
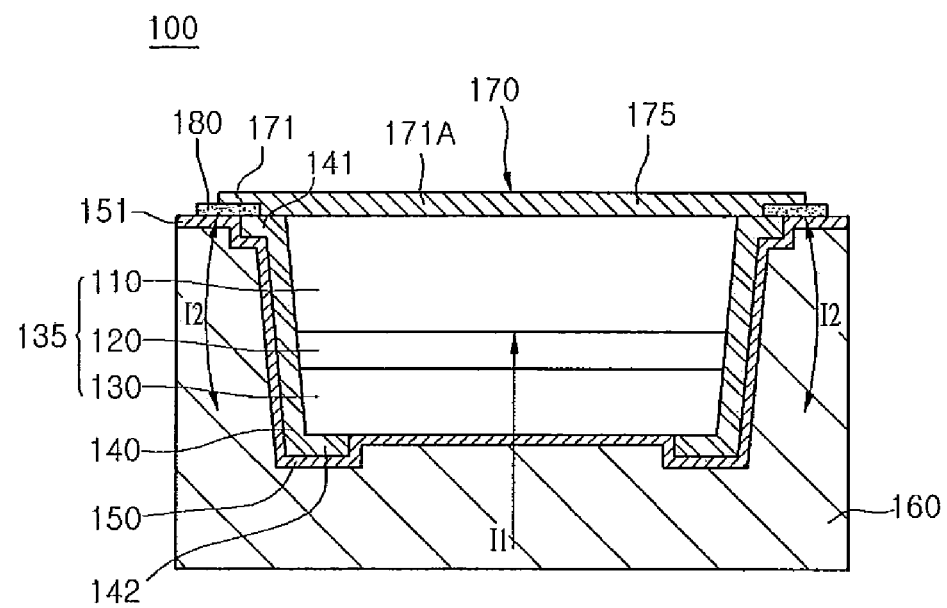

[Figure 15]
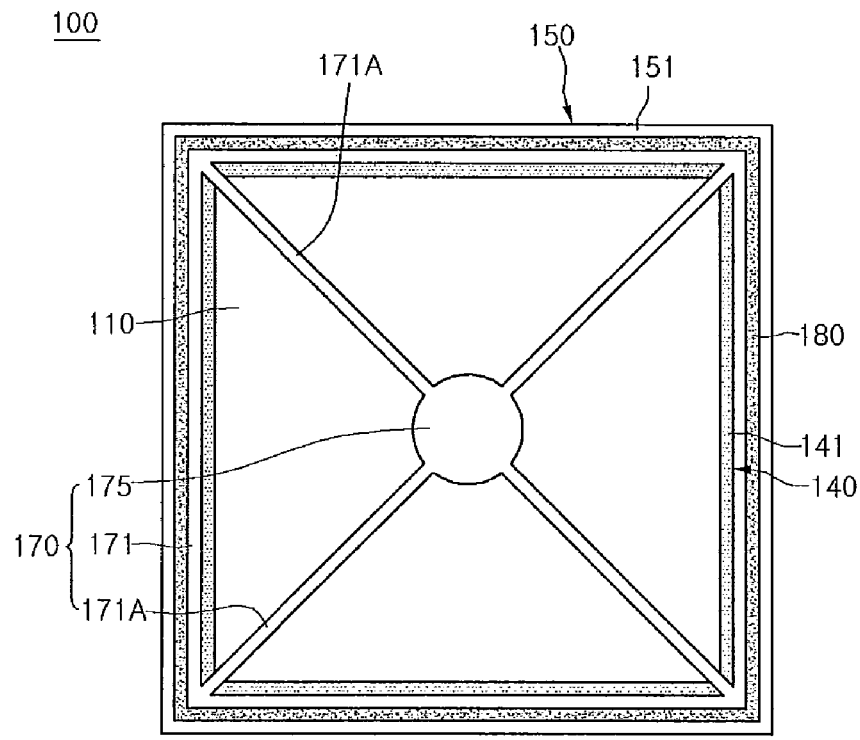
[Figure 16]
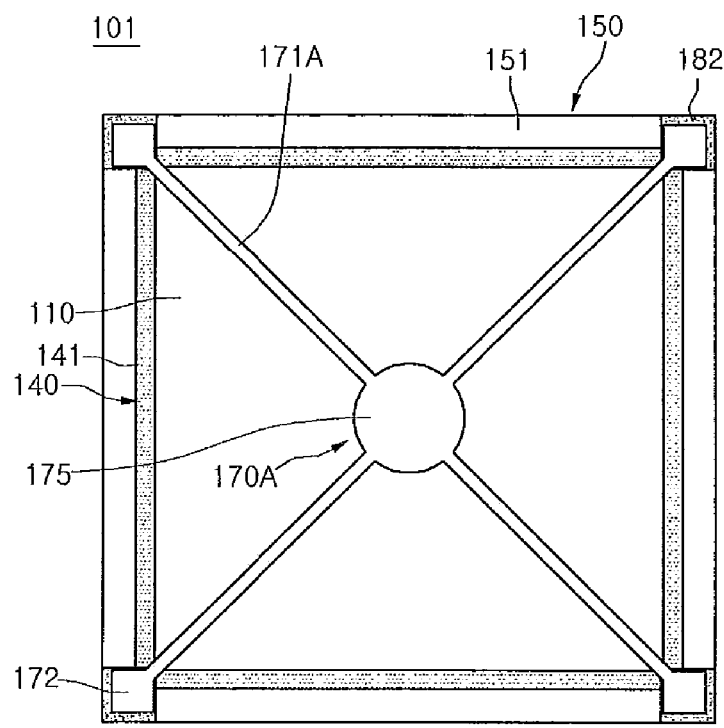

[Figure 17]
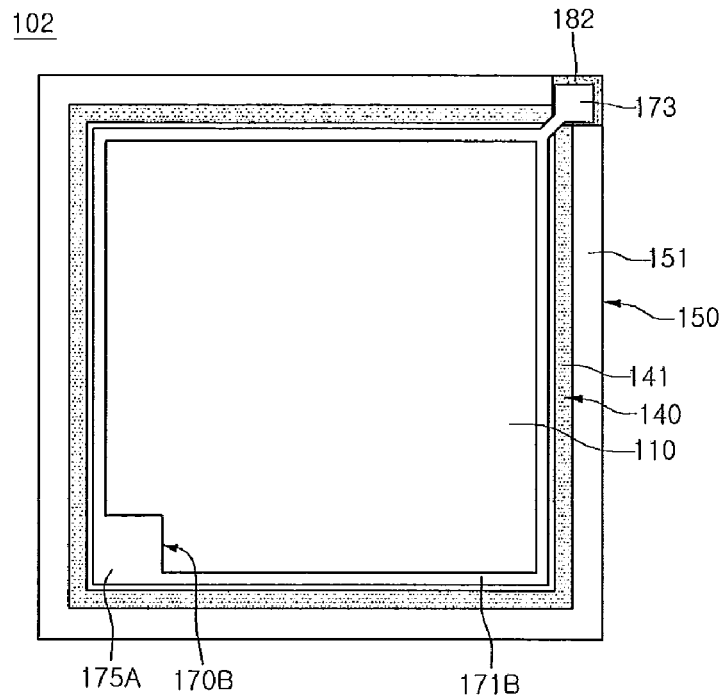
[Figure 18]
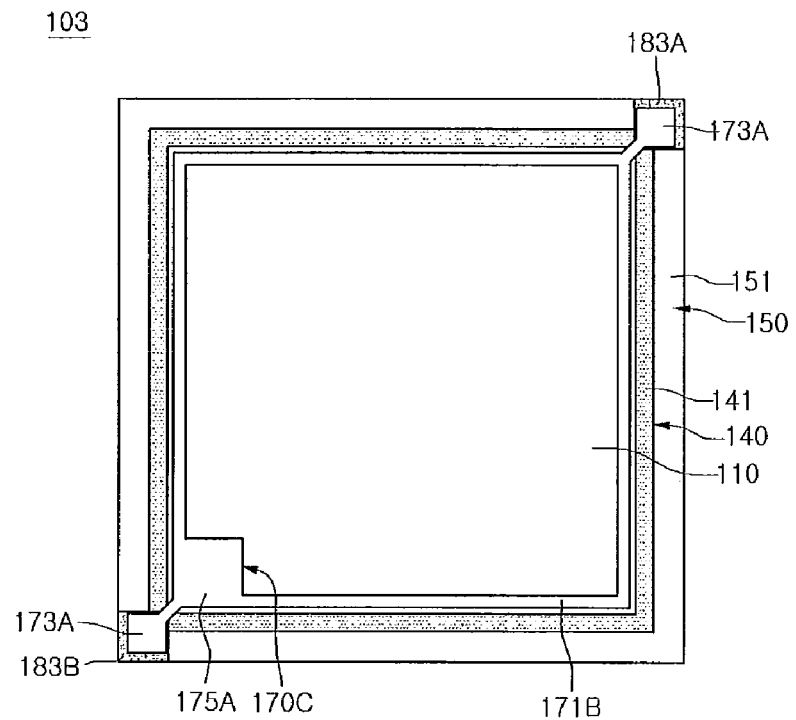

[Figure 19]
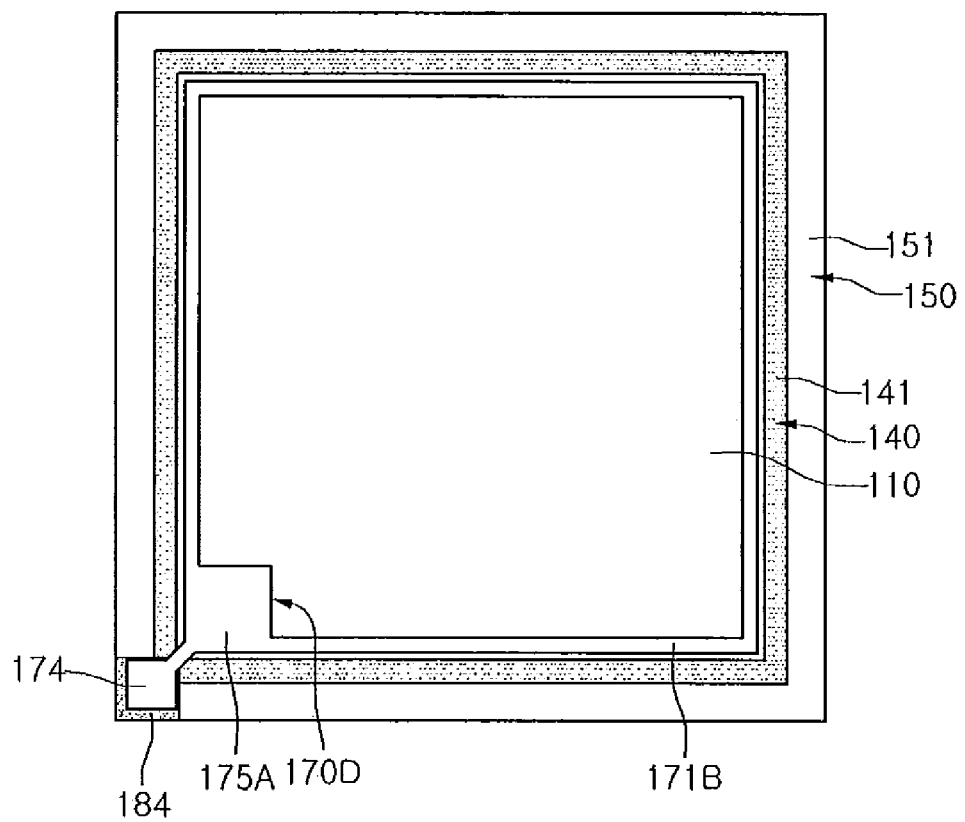

SEMICONDUCTOR LIGHT EMITTING DEVICE WITH INTEGRATED ESD PROTECTION

TECHNICAL FIELD

The present disclosure relates to a semiconductor light emitting device.

BACKGROUND ART

Group III-V nitride semiconductors have been variously applied to an optical device such as blue and green Light Emitting Diodes (LED), a high speed switching device such as a Metal Oxide Semiconductor Field Effect Transistor (MOSFET), a High Electron Mobility Transistor (HEMT) and a Hetero junction Field Effect Transistor (HFET), and a light source of a lighting device or a display device.

The nitride semiconductor is mainly used for the LED or a Laser Diode (LD), and studies have been continuously conducted to improve the manufacturing process or light efficiency of the nitride semiconductor.

DISCLOSURE

Technical Problem

Embodiments provide a semiconductor light emitting device comprising a tunnel barrier layer.

Embodiments provide a semiconductor light emitting device comprising a tunnel barrier layer which is connected to a light emitting structure in parallel.

Technical Solution

An embodiment provides a semiconductor light emitting device comprising: a light emitting structure comprising a plurality of compound semiconductor layers; an insulation layer on an outer surface of the light emitting structure; an ohmic layer under the light emitting structure and on an outer surface of the insulation layer; a first electrode layer on the light emitting structure; and a tunnel barrier layer between the first electrode layer and the ohmic layer.

An embodiment provides a semiconductor light emitting device comprising: a light emitting structure comprising a plurality of compound semiconductor layers; an insulation layer on an outer surface of the light emitting structure; an ohmic layer under the light emitting structure and on an outer surface of the insulation layer; a tunnel barrier layer on the ohmic layer; a first electrode layer on the light emitting structure, wherein a portion of the first electrode layer is connected to the tunnel barrier layer; and a conductive support member under the ohmic layer.

Advantageous Effects

Embodiments provide a semiconductor light emitting device having a tunnel barrier layer.

Embodiments can protect a semiconductor light emitting device against Electrostatic Discharge (ESD) by using a tunnel barrier layer.

Embodiments do not comprise a separate ESD protection device by connecting a tunnel barrier layer to the outside of a light emitting structure in parallel.

Embodiments can improve reliability for a light emitting device by providing a path for ESD to the outside of a light emitting structure.

DESCRIPTION OF DRAWINGS

FIG. 1 is a plan view of a semiconductor light emitting device according to a first embodiment.

FIG. 2 is a side-sectional view taken along line A-A' of FIG. 1.

FIG. 3 is a side-sectional view taken along line B-B' of FIG. 1.

FIG. 4 is a circuit diagram illustrating an equivalent circuit of FIG. 1.

FIG. 5 is a characteristic graph of the current and voltage of FIG. 1.

FIGS. 6 to 15 are diagrams illustrating a process of manufacturing the semiconductor light emitting device according to the first embodiment.

FIG. 16 is a plan view of a semiconductor light emitting device according to a second embodiment.

FIG. 17 is a plan view of a semiconductor light emitting device according to a third embodiment.

FIG. 18 is a plan view of a semiconductor light emitting device according to a fourth embodiment.

FIG. 19 is a plan view of a semiconductor light emitting device according to a fifth embodiment.

BEST MODE

Reference will now be made in detail to the embodiments of the present disclosure, examples of which are illustrated in the accompanying drawings. In description of embodiments, the 'on' or 'under' of each layer may be described with reference to the accompanying drawings, and the thickness of the each layer will also be described as an example and is not limited to the thickness of the accompanying drawings.

In description of embodiments, it will be understood that in a case where a layer (or film), a region, a pattern, or components is referred to as being 'on' or 'under' another substrate, layer (or film), region or patterns, the 'on' and 'under' comprise all the meanings of 'directly' and 'indirectly'. Moreover, any reference of the 'on' or 'under' of each layer will be described with reference to the accompanying drawings.

FIG. 1 is a plan view of a semiconductor light emitting device according to a first embodiment. FIG. 2 is a side-sectional view taken along line A-A' of FIG. 1. FIG. 3 is a side-sectional view taken along line B-B' of FIG. 1.

Referring to FIGS. 1 to 3, a semiconductor light emitting device 100 according to the first embodiment comprises a first conductive semiconductor layer 110, an active layer 120, a second conductive semiconductor layer 130, an insulation layer 140, an ohmic layer 150, a conductive support member 160, a first electrode layer 170, and a tunnel barrier layer 180.

The active layer 120 is formed under the first conductive semiconductor layer 110, and the active layer 120 may be formed in single or multiple quantum well structures. The active layer 120 may be formed of InGaN well layer/GaN barrier layer or AlGaN well layer/GaN barrier layer by using the compound semiconductor of group 3 and group 5 elements.

The active layer 120 is formed of a material having a bandgap energy according to the wavelength of an emitting light. For example, in the case of the blue light emission having 460 nm to 470 nm, the active layer 120 has InGaN well layer/GaN barrier layer and may be formed in single or multiple quantum well structures. The active layer 120 may comprise a material emitting a chromatic light such as a light having a blue wavelength, a light having a red wavelength and a light having a green wavelength. A conductive clad layer may be formed on and/or under the active layer 120. The conductive clad layer comprises AlGaN layer. Moreover, other semiconductor layer may be stacked on and/or under the active layer 120, but the semiconductor light emitting device 100 is not limited to this embodiment.

At least one second conductive semiconductor layer 130 is formed under the active layer 120, and the second conductive semiconductor layer 130 is formed along the bottom and side surface of the active layer 120. The second conductive semiconductor layer 130 may be formed of a semiconductor layer on which a second conductive dopant is doped, and the semiconductor layer may be formed of any one of group 3-group 5 compound semiconductors, for example, GaN, InN, AlN, InGaN, AlGaN, InAlGaN and AlInN. In a case where the second conductive semiconductor layer 130 is a P-type semiconductor layer, the second conductive dopant may comprise a P-type dopant such as Mg, Zn, Ca, Sr and Ba.

Moreover, an N-type semiconductor layer (not shown) or a P-type semiconductor layer (not shown) may be formed under the second conductive semiconductor layer 130. The first conductive semiconductor layer 110 may be implemented with a P-type semiconductor, and the second conductive semiconductor layer 130 may be implemented with an N-type semiconductor layer. Herein, the first conductive semiconductor layer 110, the active layer 120 and the second conductive semiconductor layer 130 may serve as a light emitting structure 135, and the light emitting structure 135 may comprise any one of an N-P junction structure, a P-junction structure, an N-P-N junction structure and a P-N-P structure.

The insulation layer 140 is formed on the outer surface of the light emitting structure 135. The insulation layer 140 is formed on the outside of the first conductive semiconductor layer 110, the active layer 120 and the second conductive semiconductor layer 130, and breaks electrical contact with other layers.

The insulation layer 140 comprises at least one of $SiO_2$, $Si_3N_4$, $Al_2O_3$, $SiO_x$, $SiO_xN_y$ and $TiO_2$, but the first embodiment is not limited to the materials.

The other end portion 142 of the insulation layer 140 may be extended to a portion of the bottom of the second conductive semiconductor layer 130, and the one end portion 141 of the insulation layer 140 is formed to be exposed to the lower portion of a chip.

The ohmic layer 150 is formed under the second conductive semiconductor and on the outer surface of the insulation layer 140, and is ohmic contacted to the second conductive semiconductor layer 130. The ohmic layer 150 may be formed of a metal material having a good ohmic characteristic and a low transmittance. For example, the ohmic layer 150 may be formed of any one of Ag, Ag alloy, Ni, Al, Al alloy, Rh, Pd, Ir, Ru, Mg, Zn, Pt, Au and Hf or the compound of a plurality of materials, but the semiconductor light emitting device 100 is not limited to this embodiment.

The one end portion 151 of the ohmic layer 150 is formed to be exposed to the outside of the upper portion of the chip.

An oxide layer of a certain pattern may be formed between the ohmic layer 150 and the second conductive semiconductor layer 130. For example, the oxide layer may comprise at least one of Indium Tin Oxide (ITO), Indium Zinc Oxide (IZO), Indium Zinc Tin Oxide (IZTO), Indium Aluminum Zinc Oxide (IAZO), Indium Gallium Zinc Oxide (IGZO), Indium Gallium Tin Oxide (IGTO), Aluminum Zinc Oxide (AZO) and Antimony Tin Oxide (ATO).

The conductive support member 160 is formed under the ohmic layer 150. The conductive support member 160 may be formed to have a certain thickness using a material such as copper, gold and carrier wafer (for example, Si, Ge, GaAs, ZnO, SiC and the like).

The first electrode layer 170 is formed on the first conductive semiconductor layer 110. The first electrode layer 170 comprises a first pad 175, an external electrode 171 and a line electrode 171A.

The first electrode layer 170 may comprise at least one of Ti, Al, In, Ta, Pd, Co, Ni, Si, Ge, Ag and Au, but the first embodiment is not limited to the materials.

At least one first pad 175 may be formed on the first conductive semiconductor layer 110. In a case where a plurality of first pads 175 are formed, the first pads 175 may be disposed spaced apart from each other. The first pad 175 may be formed in a circularity shape or a polygon shape, but the first embodiment is not limited to the shapes.

The line electrode 171A is diverged from the first pad 175 in at least one branch shape, and may be implemented in a certain pattern. The pattern of the line electrode 171A, for example, may be implemented in a straight line-shaped pattern, a curve-shaped pattern, a pattern bent by a certain angle and an intersecting cross-shaped pattern. The line electrode 171A electrically connects the first pad 175 and the external electrode 171.

The external electrode 171 is electrically connected to the line electrode 171A and/or the first pad 175, and is disposed on the outside of the upper portion of a device.

The external electrode 171 is formed on the tunnel barrier layer 180, and the ohmic layer 150 is formed under the tunnel barrier layer 180.

The external electrode 171 is disposed to be electrically opened with the ohmic layer 150, and the tunnel barrier layer 180 is disposed spaced apart from the first conductive semiconductor layer 110.

The tunnel barrier layer 180 may be formed of any one of $Al_2O_3$, $SiO_2$, $Si_3N_4$, SiCN, $TiO_2$ and $Ta_2O_3$ or may be formed of the compound of a plurality of materials.

The tunnel barrier layer 180, for example, may be formed to have the thickness of 10 to 200 Å. Herein, a voltage (hereinafter, referred to as a tunnel voltage), which leads to tunneling in the tunnel barrier layer 180, is inversely proportional to the thickness of the tunnel barrier layer 180, and the tunnel voltage can be controlled by the control of the thickness.

The tunnel barrier layer 180 is connected to the P-N junction of the light emitting structure 135 in parallel. That is, the one end of the tunnel barrier layer 180 is connected to the first conductive semiconductor layer 110 through the external electrode 171 of the first electrode layer 170, and the other end of the tunnel barrier layer 180 is connected to the second conductive semiconductor layer 130 through the ohmic layer 150.

In a case where a current equal to or less than a first voltage is applied to the light emitting device 100, the tunnel barrier layer 180 serves as a nonconductor. In a case where a current higher than the first voltage is applied to the light emitting device 100, the tunnel barrier layer 180 serves as a conductor. The resistance of the tunnel barrier layer 180 becomes less than that of the P-junction of the light emitting structure 135, and consequently a current flows through the tunnel barrier layer 180.

When a bias voltage equal to or less than the first voltage is applied to the light emitting device 100, a forward current $I_1$ flows in the light emitting structure 135, for example, the second conductive semiconductor layer 130, the active layer 120 and the first conductive semiconductor layer 110. At this point, the tunnel barrier layer 180 serves as a nonconductor through which the forward current $I_1$ does not flow.

Herein, the first voltage of the semiconductor light emitting device 100 may be set at a range of the driving voltage of LED, for example, 4V to 6V, which may be changed.

In a case where a bias voltage, for example, ESD (i.e., thousands volts), higher than the first voltage is applied to the semiconductor light emitting device 100, the resistance of the tunnel barrier layer 180 becomes less than that of the P-N junction of the light emitting structure 135 so that it has a conductor characteristic. Accordingly, the tunnel barrier layer 180 serves as a conductor through which a tunneling current $I_2$ flows by a tunneling effect. Since most of the tunneling current $I_2$ flows through the tunnel barrier layer 180, the light emitting structure 135 can be protected against the ESD.

The tunnel barrier layer 180 serves as a conductor when a voltage higher than the first voltage is applied to it, and thus protects the light emitting structure 135. Herein, the light emitting structure 135 may comprise any one of an N-P junction structure, a P-junction structure, an N-P-N junction structure and a P-N-P structure.

FIG. 4 is a circuit diagram illustrating an equivalent circuit of FIG. 1.

Referring to FIG. 4, a light emitting device 100A is an element which is connected to a tunnel barrier unit 100B in parallel. The tunnel barrier unit 100B serves as a nonconductor when a voltage equal to or less than the first voltage is applied to it, and serves as a conductor when a voltage higher than the first voltage is applied to it.

Herein, the tunnel barrier unit 100B comprises an electric circuit comprising a tunnel barrier layer, a second electrode layer and an ohmic layer.

When a certain power supply voltage is applied through a second electrode P2, the forward current $I_1$ equal to or less than the first voltage is applied to a first electrode P1 through the light emitting device 100A. When the tunneling current $I_2$ higher than the first voltage is applied through the second electrode P2, the tunneling current $I_2$ flows through the tunnel barrier unit 100B.

The tunnel barrier unit 100B serves as a conductor when the tunneling current $I_2$ higher than the first voltage flows through the first electrode P1 or the second electrode P2, and most of the tunneling current $I_2$ flows through the tunnel barrier unit 100B. Accordingly, the light emitting device 100A can be protected.

FIG. 5 is a characteristic graph of the current and voltage of FIG. 1. Such a characteristic graph illustrates the comparison result of the current and voltage characteristics of the light emitting device (for example, LED) and the tunnel barrier layer.

Referring to FIG. 5, when a first tunnel voltage T1 and a second tunnel voltage T2 are exceeded, a current flows in the tunnel barrier layer by a tunneling effect. The first tunnel voltage may be a negative critical voltage, and the second tunnel voltage may be a positive critical voltage. The critical voltages may be defined as the abnormal voltage of the light emitting diode.

When a current lower than the first tunnel voltage T1 is applied to the tunnel barrier unit 100E or a current higher than the second tunnel voltage T2 is applied to the tunnel barrier unit 100B, a current flows in the tunnel barrier unit 100B by a tunneling effect. The first tunnel voltage T1 and the second tunnel voltage T2 may vary according to a range of the driving voltage of the light emitting device, for example, 4V to 6V.

In a case where a range of the driving voltage of the semiconductor light emitting device (for example, LED) is 4V, when a voltage equal to or less than −5V is applied or a voltage equal to or higher than +5V is applied, a current flows through the tunnel barrier unit 100B.

Herein, the tunnel voltages T1 and T2, which lead to tunneling in the tunnel barrier unit 100B, is inversely proportional to the thickness of the tunnel barrier layer, but the first embodiment is not limited to the tunnel voltages T1 and T2.

FIGS. 6 to 15 are diagrams illustrating a process of manufacturing the semiconductor light emitting device according to the first embodiment.

Referring to FIG. 6, an undoped semiconductor layer 107 is formed on a substrate 105, and a light emitting structure 135 comprising a plurality of compound semiconductor layers 110, 120 and 130 is formed on the undoped semiconductor layer 107.

A material of the substrate 105 may be selected from the group consisting of sapphire substrate ($Al_2O_3$), GaN, SiC, ZnO, Si, GaP, InP and GaAs. A certain concave-convex pattern may be formed on the substrate 105.

A nitride semiconductor is grown on the substrate 105, and may be grown by a growth equipment such as electron beam evaporator, Physical Vapor Deposition (PVD), Chemical Vapor Deposition (CVD), Plasma Laser Deposition (PLD), dual-type thermal evaporator, sputtering, Metal Organic Chemical Vapor Deposition (MOCVD). However, the first embodiment is not limited to the equipments.

Other semiconductor layer (not shown), for example, a buffer layer consisting of group 3-group 5 compound semiconductor, may be formed on the substrate 105, but the semiconductor light emitting device 100 is not limited to this embodiment. The undoped semiconductor layer 107 is formed on the substrate 105 or the buffer layer (not shown), and the undoped semiconductor layer 107 may be implemented with an undoped GaN layer.

The light emitting structure 135 comprises the first conductive semiconductor layer 110, the active layer 120 and the second conductive semiconductor layer 130.

A first conductive dopant is doped on the first conductive semiconductor layer 110, which may be formed of any one of group 3-group 5 compound semiconductors such as GaN, InN, AlN, InGaN, AlGaN, InAlGaN and AlInN. In a case where the first conductive semiconductor layer 110 is an N-type semiconductor layer, the first conductive dopant is an N-type dopant, which comprises Si, Ge, Sn, Se and Te.

The active layer 120 is formed on the first conductive semiconductor layer 110, and the active layer 120 may be formed in single or multiple quantum well structures. The active layer 120 may be formed of InGaN well layer/GaN barrier layer or AlGaN well layer/GaN barrier layer by using the compound semiconductor of group 3 and group 5 elements.

The second conductive semiconductor layer 130 may be formed on the active layer 120. The second conductive semiconductor layer 130 may be formed of any one of group 3-group 5 compound semiconductors, for example, GaN, InN, AlN, InGaN, AlGaN, InAlGaN and AlInN, wherein a second conductive dopant is doped on the group 3-group 5 compound semiconductors. In a case where the second conductive semiconductor layer 130 is a P-type semiconductor layer, the second conductive dopant may comprise a P-type dopant such as Mg, Zn, Ca, Sr and Ba.

An N-type semiconductor layer (not shown) or a P-type semiconductor layer (not shown) may be formed on the second conductive semiconductor layer 130. Herein, the light emitting structure 135 may comprise any one of an N-P junction structure, a P-junction structure, an N-P-N junction structure and a P-N-P structure.

Referring to FIG. 7, a dry-etching process is performed on a chip boundary region 137 on the substrate 105. In this case, the substrate 105 may be exposed to the chip boundary region 137. Herein, the outer surface of the light emitting structure 135 may be formed to be vertical or slope, but the semiconductor light emitting device 100 is not limited to this embodiment.

Referring to FIG. 8, the insulation layer 140 is formed on the outer surface of the light emitting structure 135. The insulation layer 140 is formed on the outside of the first conductive semiconductor layer 110, the active layer 120 and the second conductive semiconductor layer 130, and breaks electrical contact with other layers.

The one end portion 141 of the insulation layer 140 is formed on the substrate 105, and the other end portion 142 of the insulation layer 140 is formed on a portion of the top of the second conductive semiconductor layer 110. The insulation layer 140 comprises at least one of $SiO_2$, $Si_3N_4$, $Al_2O_3$, $SiO_x$, $SiO_xN_y$ and $TiO_2$, but the first embodiment is not limited to the materials.

Referring to FIG. 9, the ohmic layer 150 is formed on the second conductive semiconductor layer 130 and the insulation layer 140. The ohmic layer 150 is ohmic contacted to the second conductive semiconductor layer 130. The one end portion 151 of the ohmic layer 150 is extended and formed on the substrate 105.

The ohmic layer 150 may be formed of a metal material having a good ohmic characteristic and a low transmittance. For example, the ohmic layer 150 may be formed of any one of Ag, Ag alloy, Ni, Al, Al alloy, Rh, Pd, Ir, Ru, Mg, Zn, Pt, Au and Hf or the compound of a plurality of materials, and may be stacked in a single layer or multiple layers. However, the semiconductor light emitting device 100 is not limited to this embodiment.

An oxide layer of a certain pattern may be formed between the ohmic layer 150 and the second conductive semiconductor layer 130. For example, the oxide layer may comprise at least one of Indium Tin Oxide (ITO), Indium Zinc Oxide (IZO), Indium Zinc Tin Oxide (IZTO), Indium Aluminum Zinc Oxide (IAZO), Indium Gallium Zinc Oxide (IGZO), Indium Gallium Tin Oxide (IGTO), Aluminum Zinc Oxide (AZO) and Antimony Tin Oxide (ATO).

Referring to FIG. 10, the conductive support number 160 is formed on the ohmic layer 150. The conductive support number 160 may be formed of a material such as copper, gold and carrier wafer (for example, Si, Ge, GaAs, ZnO, SiC and the like).

Referring to FIG. 10, the conductive support member 160 is formed on the ohmic layer 150. The conductive support member 160 may be formed of a material such as copper, gold and carrier wafer (for example, Si, Ge, GaAs, ZnO, SiC and the like).

Referring to FIGS. 10 and 11, the conductive support member 160 is disposed in a base, and the substrate 105 is removed by a Laser Lift Off (LLO) process. In the removing process of the substrate 105, when a laser having the wavelength of a certain region is irradiated to the substrate 105, a thermal energy is concentrated on the boundary surface between the substrate 105 and the undoped semiconductor layer 107 so that the substrate 105 is separated. The substrate 105 may be separated by another process. For example, the undoped semiconductor layer 107 is removed by applying an Inductively Coupled Plasma Reactive Ion Etching (ICP-RIE) process to the undoped semiconductor layer 107, and thus the substrate 105 can be separated. Herein, the removing process of the substrate 105 is not limited to this embodiment.

The end portion of the insulation 140 and the end portion of the ohmic layer 150 are exposed to the upper portion of the chip.

Referring to FIGS. 12 and 13, the tunnel barrier layer 180 is formed on the insulation layer 140 and the ohmic layer 150.

The tunnel barrier layer 180 is formed on the end portion 141 of the insulation layer 140 and the end portion 151 of the ohmic layer 150. Also, the tunnel barrier layer 180 does not contact the insulation layer 140 and can be formed only on the end portion 151 of the ohmic layer 150.

The tunnel barrier layer 180 may be formed of any one of $SiO_2$, $Si_3N_4$, $Al_2O_3$, $SiO_x$, $SiO_xN_y$ and $TiO_2$ or the compound of a plurality of materials. The tunnel barrier layer 180 may be deposited by any one of Chemical Vapor Deposition (CVD), Physical Vapor Deposition (PVD) and Atomic Layer Deposition (ALD).

The tunnel barrier layer 180 allows the top of the ohmic layer 150 to be formed in a belt shape or a frame shape, and is disposed spaced apart from the first conductive semiconductor layer 110.

The tunnel barrier layer 180, for example, may be formed to have the thickness of 10 to 200 Å. Herein, a voltage, which leads to tunneling in the tunnel barrier layer 180, is inversely proportional to the thickness of the tunnel barrier layer 180.

Referring to FIGS. 14 and 15, the first electrode layer 170 is formed on the first conductive semiconductor layer 110. The first electrode layer 170 comprises the first pad 175, the external electrode 171, and the line electrode 171A.

The first electrode layer 170 may comprise at least one of Ti, Al, In, Ta, Pd, Co, Ni, Si, Ge, Ag and Au, but the first embodiment is not limited to the materials.

At least one first pad 175 may be formed on the first conductive semiconductor layer 110. In a case where a plurality of first pads 175 are formed, the first pads 175 may be disposed spaced apart from each other. The first pad 175 may be formed in circularity or polygon, but is not limited to the shapes.

The line electrode 171A is diverged from the first pad 175 in at least one branch shape, and may be implemented with a certain pattern. The pattern of the line electrode 171A, for example, may be implemented with a straight line-shaped pattern, a curve-shaped pattern, a pattern bent by a certain angle and an intersecting cross-shaped pattern. The line electrode 171A electrically connects the first pad 175 and the external electrode 171.

The external electrode 171 is disposed in the outer side of the upper portion of the chip, and is electrically connected to the line electrode 171A and/or the first pad 175. The external electrode 171 is connected through the line electrode 171A that is diverged from the first pad 175 in a cross-shaped pattern or an X-shaped pattern, but the first embodiment is not limited to the patterns.

The external electrode 171 is formed on the tunnel barrier layer 180, and is formed to be electrically with the ohmic layer 150. The external electrode 171 may be formed in the same pattern as that of the tunnel barrier layer 180.

In the semiconductor light emitting device 100, the tunnel barrier layer 180 is connected to the P-junction of the light emitting structure in parallel. That is, the one end of the tunnel barrier layer 180 is connected to the first conductive semiconductor layer 110 through the external electrode 171 of the first electrode layer 170, and the other end of the tunnel barrier layer 180 is connected to the second conductive semiconductor layer 130 through the ohmic layer 150.

In a case where a current equal to or less than the first voltage is applied to the light emitting device 100, the tunnel barrier layer 180 serves as a nonconductor. In a case where a current higher than the first voltage is applied to the semiconductor light emitting device 100, the tunnel barrier layer 180 serves as a conductor. The resistance of the tunnel barrier layer 180 becomes less than that of the P-N junction of the light emitting structure 135 when the tunnel barrier layer 180 is the conductor, and consequently a current flows through the tunnel barrier layer 180.

When a bias voltage equal to or less than the first voltage is applied to the light emitting device 100, the forward current $I_1$ flows in the light emitting structure 135, for example, the second conductive semiconductor layer 130, the active layer 120 and the first conductive semiconductor layer 110. At this point, the tunnel barrier layer 180 serves as a nonconductor through which the forward current $I_1$ does not flow.

Herein, the first voltage may be set at a range of the driving voltage of the semiconductor light emitting device 100, for example, 4V to 6V.

In a case where a bias voltage, for example, ESD (i.e., thousands volts), higher than the first voltage is applied to the semiconductor light emitting device 100, the resistance of the tunnel barrier layer 180 becomes less than that of the P-N junction of the light emitting structure 135 so that it has a conductor characteristic. Accordingly, the tunnel barrier layer 180 serves as a conductor through which the tunneling current $I_2$ flows by a tunneling effect. Since most of the tunneling current $I_2$ flows through the tunnel barrier layer 180, the light emitting structure 135 can be protected against the ESD.

Herein, the light emitting structure 135 comprises any one of an N-P junction structure, an N-P-junction structure and a P-N-P structure, in addition to a P-junction structure.

FIG. 16 is a plan view of a semiconductor light emitting device according to a second embodiment. In description of the second embodiment, repetitive description on the same elements as those of the first embodiment will be omitted and refers to that of the first embodiment.

Referring to FIG. 16, a semiconductor light emitting device 101 according to the second embodiment comprises a plurality of tunnel barrier layers 182. The tunnel barrier layer 182 is disposed in a circularity pattern or a polygon pattern in the each corner region of the semiconductor light emitting device 101, and is formed on the insulation layer 140 and the ohmic layer 150.

The external electrode 172 of the first electrode layer 170A is formed on the tunnel barrier layer 182, and the external electrode 172 is electrically connected to the first pad 175 through the line electrode 171A.

The pattern of tunnel barrier layer 182 may be the same as or different from that of the external electrode 172, but the semiconductor light emitting device 101 is not limited to this embodiment.

FIG. 17 is a plan view of a semiconductor light emitting device according to a third embodiment. In description of the third embodiment, repetitive description on the same elements as those of the first embodiment will be omitted and refers to that of the first embodiment.

Referring to FIG. 17, a semiconductor light emitting device 102 according to the third embodiment comprises one tunnel barrier layer 182. The tunnel barrier layer 182 is formed in a circularity pattern or a polygon pattern on a corner of a chip, and is formed on the insulation layer 140 and the ohmic layer 150.

The external electrode 173 of a first electrode layer 170B is formed on the tunnel barrier layer 182, and the external electrode 173 is electrically connected to a first pad 175A through a line electrode 171A.

The first pad 175A may be disposed on a corner of the first conductive semiconductor layer 110. For example, the first pad 175A may be formed to face with the external electrode 173. The line electrode 171B is formed along the outer perimeter of the first conductive semiconductor layer 110 from the first pad 175A, and is electrically connected to the external electrode 173.

FIG. 18 is a plan view of a semiconductor light emitting device according to a fourth embodiment. In description of the fourth embodiment, repetitive description on the same elements as those of the first embodiment will be omitted and refers to that of the first embodiment.

Referring to FIG. 18, a semiconductor light emitting device 103 according to the fourth embodiment comprises tunnel barrier layers 183A and 183B facing with each other in the both corners of a chip. The tunnel barrier layers 183A and 183B face with each other, and may be formed in the pattern of the same shape or the patterns of different shapes. The shape of the pattern may be implemented in a circularity pattern or a polygon pattern, but the semiconductor light emitting device 103 is not limited to this embodiment.

The external electrodes 173A and 173B of a first electrode layer 170C are formed on the tunnel barrier layers 183A and 183B, and are electrically connected to the first pad 175A through the line electrode 171B. The first pad 175A may be disposed on at least one of the corners of the first conductive semiconductor layer 110, and may be formed to be near to the external electrode 173B.

FIG. 19 is a plan view of a semiconductor light emitting device according to a fifth embodiment. In description of the fifth embodiment, repetitive description on the same elements as those of the first embodiment will be omitted and refers to that of the first embodiment.

Referring to FIG. 19, a semiconductor light emitting device 104 according to the fifth embodiment comprises one tunnel barrier layer 184. The tunnel barrier layer 184 is formed in a circularity pattern or a polygon pattern in a corner of a chip, and is disposed on the insulation layer 140 and the ohmic layer 150.

The external electrode 174 of a first electrode layer 170D is formed on the tunnel barrier layer 184, and the external electrode 174 is electrically connected to a first pad 175A through the line electrode 171B.

The first pad 175A may be disposed on a corner of the first conductive semiconductor layer 110. For example, the first pad 175A may be formed in a corner adjacent to the external electrode 174. The line electrode 171B is formed along the outer perimeter of the first conductive semiconductor layer 110 from the first pad 175A, and is electrically connected to the external electrode 173.

The tunnel barrier layers 180 to 184 according to embodiments may be formed in a belt shape, a circularity shape or a polygon shape on the exposed portion of the ohmic layer 150, and may be formed along the outer perimeter of a chip on a region or entire region of a corner of the chip. The tunnel barrier layers 180 to 184 may be formed in a circularity pattern or a polygon pattern in the each corner of the chip. As described above, the tunnel barrier layers 180 to 184 may be applied to a horizontal semiconductor light emitting device, in addition to a vertical semiconductor light emitting device.

Moreover, the tunnel barrier layers 180 to 184 are connected to any one of a P-junction structure, an N-P junction structure, an N-P-junction structure and a P-N-P structure, which are the light emitting structure 135, in parallel, and thus can protect the light emitting structure 135.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifi-

The invention claimed is:

1. A semiconductor light emitting device with integrated electrostatic discharge (ESD) protection, comprising:
   a light emitting structure comprising a plurality of compound semiconductor layers;
   an insulation layer disposed on a side surface of the light emitting structure;
   a conductive layer disposed under the light emitting structure;
   a first electrode layer comprising
      a line electrode disposed on the light emitting structure, and
      a first electrode disposed outwardly from an outer area of the light emitting structure; and
   a tunnel barrier layer between the first electrode of the first electrode layer and a first portion of the conductive layer,
   wherein the light emitting structure is disposed between the conductive layer and the line electrode of the first electrode layer,
   wherein the tunnel barrier layer is disposed outwardly from the outer area of the light emitting structure, and
   wherein the plurality of compound semiconductor layers comprise
      a first conductive semiconductor layer,
      a second conductive semiconductor layer between the first conductive semiconductor layer and the conductive layer, and
      an active layer between the first conductive semiconductor layer and the second conductive semiconductor layer.

2. The semiconductor light emitting device according to claim 1, further comprising:
   a conductive support member disposed under the conductive layer and disposed on the side surface of the light emitting structure,
   wherein the conductive layer comprises an ohmic layer.

3. The semiconductor light emitting device according to claim 2, wherein a first portion of the insulation layer is disposed between the tunnel barrier layer and the first portion of the conductive layer.

4. The semiconductor light emitting device according to claim 1, wherein the tunnel barrier layer is formed according to a top surface of the first portion of the conductive layer or on a part of the top surface of the first portion of the conductive layer.

5. The semiconductor light emitting device according to claim 1,
   wherein the first electrode layer comprises at least one first pad, and
   wherein the first electrode is connected to the first pad and is disposed on the tunnel barrier layer.

6. The semiconductor light emitting device according to claim 5, wherein the first electrode layer comprises at least one line electrode diverged from the first pad and connected to the first electrode.

7. The semiconductor light emitting device according to claim 1, wherein the tunnel barrier layer comprises at least one of $Al_2O_3$, $SiO_2$, $Si_3N_4$, SiCN, $TiO_2$ and $Ta_2O_3$.

8. The semiconductor light emitting device according to claim 1, wherein the tunnel barrier layer is disposed on a different area of the first portion of the conductive layer.

9. The semiconductor light emitting device according to claim 1, wherein a thickness of the tunnel barrier layer is about 10 to 200 Å.

10. The semiconductor light emitting device according to claim 1, wherein the tunnel barrier layer is formed in a plurality and the plurality of tunnel barrier layers are spaced apart from each other.

11. A semiconductor light emitting device with integrated electrostatic discharge (ESD) protection, comprising:
    a light emitting structure comprising a plurality of compound semiconductor layers,
    wherein the plurality of compound semiconductor layers comprise
       a first conductive semiconductor layer,
       a second conductive semiconductor layer under the first conductive semiconductor layer, and
       an active layer between the first conductive semiconductor layer and a second conductive semiconductor layer;
    an insulation layer on a side surface of the light emitting structure;
    a conductive layer comprising an ohmic layer disposed under the second conductive semiconductor layer of the light emitting structure, a first portion of the conductive layer disposed outwardly from an outer area of the light emitting structure;
    a tunnel barrier layer on the first portion of the conductive layer and disposed outwardly from the outer area of the light emitting structure;
    a first electrode layer comprising
       a line electrode disposed on the first conductive semiconductor layer of the light emitting structure, and
       a first electrode disposed outwardly from the outer area of the light emitting structure,
    wherein the first electrode of the first electrode layer is connected to the tunnel barrier layer; and
    a conductive support member disposed under the conductive layer and including a first portion disposed outwardly from the outer area of the light emitting structure,
    wherein the light emitting structure is disposed between the conductive layer and the first electrode layer.

12. The semiconductor light emitting device according to claim 11, wherein the light emitting structure comprises at least one of a P-N junction structure, an N-P junction structure, a P-N-P structure and an N-P-N junction structure.

13. The semiconductor light emitting device according to claim 11, wherein the tunnel barrier layer is formed in a pattern of the same shape as that of the first electrode layer.

14. The semiconductor light emitting device according to claim 11, wherein the tunnel barrier layer has a conductor characteristic when an abnormal voltage is applied through the first electrode layer or the conductive support member.

15. The semiconductor light emitting device according to claim 11, wherein the tunnel barrier layer comprises an insulation material, and is connected to the light emitting structure in parallel.

16. The semiconductor light emitting device according to claim 11,
    wherein the first electrode layer comprises:
       at least one first pad disposed on the light emitting structure; and the line electrode is diverged from the first pad, and
wherein the first electrode is connected to the line electrode and the tunnel barrier layer.

17. A semiconductor light emitting device with integrated electrostatic discharge (ESD) protection, comprising:
   a light emitting structure comprising a first conductive semiconductor layer, a second conductive semiconductor layer, and an active layer between the first conductive semiconductor layer and the second conductive semiconductor layer;
   an insulation layer disposed on a side surface of the light emitting structure;
   a conductive layer comprising an ohmic layer disposed under the second conductive semiconductor layer and including a first portion disposed outwardly from an outer area of the light emitting structure;
   a first electrode layer comprising
      a line electrode disposed on the first conductive semiconductor layer, and
      a first electrode disposed outwardly from the outer area of the light emitting structure;
   a conductive support member disposed under the conductive layer, wherein a first portion of the conductive support member is disposed on the side surface of the light emitting structure; and
   a tunnel barrier layer disposed on the first portion of the conductive support member,
   wherein the light emitting structure is disposed between the conductive layer and the first electrode layer,
   wherein the first electrode of the first electrode layer is disposed on the tunnel barrier layer, and
   wherein the tunnel barrier layer is disposed outwardly from the outer area of the light emitting structure.

18. The semiconductor light emitting device according to claim 17, wherein the conductive layer includes
   a first portion disposed between the tunnel barrier layer and the first portion of the conductive support member, and
   a second portion disposed between the insulation layer and the first portion of the conductive support member.

19. The semiconductor light emitting device according to claim 18, wherein the first portion of conductive support member contacts with the first portion of the conductive layer.

20. The semiconductor light emitting device according to claim 17, wherein the tunnel barrier layer comprises an insulation material and is spaced apart from a surface of the light emitting structure.

* * * * *